United States Patent [19]
Choi et al.

[11] Patent Number: 5,736,447
[45] Date of Patent: Apr. 7, 1998

[54] METHOD FOR MANUFACTURING A BIPOLAR JUNCTION TRANSISTOR HAVING A POLYSILICON EMITTER

[75] Inventors: Jung-dal Choi; Byeung-chul Kim; Dong-soo Chang, all of Suwon, Rep. of Korea

[73] Assignee: Samsung Electronics Co., Ltd., Suwon, Rep. of Korea

[21] Appl. No.: 686,411

[22] Filed: Jul. 26, 1996

Related U.S. Application Data

[63] Continuation of Ser. No. 453,708, May 30, 1995, abandoned.

[30] Foreign Application Priority Data

Jun. 13, 1994 [KR] Rep. of Korea ............ 94-13259

[51] Int. Cl.$^6$ ................................................ H01L 21/331
[52] U.S. Cl. .............................. 438/365; 438/368; 438/700
[58] Field of Search .............................. 437/31, 32, 162

[56] References Cited

U.S. PATENT DOCUMENTS

| | | | |
|---|---|---|---|
| 4,497,106 | 2/1985 | Momma et al. | 437/162 |
| 5,028,550 | 7/1991 | Hirakawa | 437/162 |
| 5,100,812 | 3/1992 | Yamada et al. | 437/31 |
| 5,296,388 | 3/1994 | Kameyama et al. | 437/162 |
| 5,420,050 | 5/1995 | Jerome et al. | 437/162 |

*Primary Examiner*—Tuan H. Nguyen
*Attorney, Agent, or Firm*—Cushman Darby & Cushman IP Group of Pillsbury Madison & Sutro LLP

[57] ABSTRACT

A method for manufacturing a bipolar junction transistor which includes the steps of forming spaced-apart base and collector regions in a surface region of a semiconductor substrate, forming a first insulating film on the semiconductor substrate, forming an emitter contact hole in the first insulating film, to thereby expose a first portion of the base region, forming a first conductive layer on the first insulating film and the exposed first portion of said base region, the first conductive layer being comprised of a first conductive material such as polysilicon, ion-implanting impurities into the first conductive layer, forming base and collector contact holes in a first resultant structure comprised of the first insulating film and the first conductive layer, to thereby expose a second portion of the base region spaced-apart from the first portion of the base region, and a portion of the collector region, respectively, forming a second conductive layer on a second resultant structure obtained by the preceding steps, the second conductive layer being comprised of a second conductive material such as in-situ doped polysilicon, and, patterning a third resultant structure comprised of the first and second conductive layers in such a manner as to form an emitter comprised of the first conductive material, an emitter contact in contact with the emitter, a base contact in contact with the exposed second portion of the base region, and a collector contact in contact with the exposed portion of the collector region, the emitter, base, and collector contacts being comprised of the second conductive material and being spaced-apart from one another.

17 Claims, 5 Drawing Sheets

5,736,447

METHOD FOR MANUFACTURING A BIPOLAR JUNCTION TRANSISTOR HAVING A POLYSILICON EMITTER

This is a continuation of application Ser. No. 08/453,708, filed on May 30, 1995, which is abandoned.

BACKGROUND OF THE INVENTION

The present invention relates generally to a method for manufacturing a bipolar junction transistor suitable for use in very large-scale integrated (VLSI) circuits, and, more particularly, to a method for manufacturing a bipolar junction transistor having a polysilicon emitter.

In general, bipolar junction transistors (BJTs) have a greater current capacity and faster operating speed than metal-oxide semiconductor field-effect transistors (MOSFETs). As such, contemporary semiconductor products utilize BJTs in place of MOSFETs in specific circuit portions thereof where the above-noted superior BJT characteristics are desirable.

With reference now to FIG. 1, a conventional BJT will now be described. More particularly, the conventional BJT includes a base region 12 formed in a surface region of a semiconductor substrate 10, an emitter region 14 formed in the base region 12, and a collector region 16 formed in a surface region of the semiconductor substrate 10 in spaced-apart relationship to the base region 12. An insulating film 18 is formed on the upper surface of the substrate 10. An emitter contact 20, a base contact 22, and a collector contact 24 are provided through corresponding contact holes provided in the insulating film 18.

One technique that has been proposed to increase the current gain of the BJT is to increase the collector current by high-density doping of the emitter. However, this technique undesirably lowers the breakdown voltage and undesirably increases the junction capacitance of the device.

One solution which has been proposed to overcome the above-stated problems associated with increasing the collector current by high-density doping of the emitter is to form the emitter of the BJT by depositing a polysilicon layer on the semiconductor substrate, and then performing an ion-implantation process on the deposited polysilicon layer, rather than forming the emitter by performing an ion-implantation process on the semiconductor substrate itself. (See, *Silicon Processing for the VLSI Era*, by S. Wolf, Lattice Press, 1990, Vol. 2, pp. 501–506).

With reference now to FIGS. 2–8, a conventional method for manufacturing a PNP-type BJT having a polysilicon emitter will now be described. More particularly, with particular reference now to FIG. 2, a photoresist layer (not shown in its entirety) is deposited on the upper surface of a semiconductor substrate 30 having a collector region 32 formed in a surface region thereof. Subsequently, the photoresist layer is etched by a photolithographic process in such a manner as to form a photoresist pattern 34. Then, N-type impurities, e.g., phosphorus (P) ions, are injected into a surface region of the semiconductor substrate 30, using the photoresist pattern 34 as an ion-implantation mask, to thereby form a base region 36 in spaced-apart relationship to the collector region 32.

With particular reference now to FIG. 3, the photoresist pattern 34 is then removed, and an oxide film 38 is formed to a thickness of 500–2,000 angstroms, on the upper surface of the substrate 30. Next, a hole is formed in the oxide film 38, to thereby expose a portion of the base region 36.

With particular reference now to FIG. 4, a polysilicon layer 40 is then deposited on the oxide film 38 and the exposed portion of the base region 36, to a thickness of 500–2,000 angstroms. Then, P-type impurities, e.g., boron (B) ions, are ion-implanted into the polysilicon layer 40. Next, the resultant structure is annealed, to thereby diffuse the P-type impurities from the polysilicon layer 40 into the base region 36, to thereby form an emitter region 42 in the base region 36.

With particular reference now to FIG. 5, the impurity-doped polysilicon layer 40 is then patterned in such a manner as to form a polysilicon emitter 44 in contact with the emitter region 42.

With particular reference now to FIG. 6, an insulating material, e.g., an oxide, is then deposited on the resultant structure shown in FIG. 5, to thereby form an oxide film 46.

With particular reference now to FIG. 7, the oxide film 46 is first isotropically etched, and then anisotropically etched, to thereby form an emitter contact hole e, a base contact hole b, and a collect or contact hole c in the oxide film 46.

With particular reference now to FIG. 8, a conductive layer (not shown in its entirety) is deposited on the resultant structure shown in FIG. 7, to thereby fill the emitter, base, and collector contact holes, e, b, and c, respectively, with conductive material. The conductive layer is then patterned in such a manner as to form an emitter contact 50 in contact with the polysilicon emitter 44, a base contact 52 in contact with the base region 36, and a collector contact 54 in contact with the collector region 32.

The above-described conventional method for manufacturing a PNP-type BJT having a polysilicon emitter results in a BJT having a shallow emitter region 42, which effectively minimizes the base-emitter junction capacitance. However, this method requires additional photolithographic etching steps relative to the previous technology, thereby commensurately increasing the cost and complexity of the manufacturing process.

Based on the above, it can be appreciated that there presently exists a need in the art for a method for manufacturing a BJT having a polysilicon emitter which overcomes the above-described drawbacks and shortcomings of the presently available technology. The present invention fulfills this need.

SUMMARY OF THE INVENTION

The present invention encompasses a method for manufacturing a bipolar junction transistor which includes the steps of forming spaced-apart base and collector regions in a surface region of a semiconductor substrate, forming a first insulating film on the semiconductor substrate, forming an emitter contact hole in the first insulating film, to thereby expose a first portion of the base region, forming a first conductive layer on the first insulating film and the exposed first portion of said base region, the first conductive layer being comprised of a first conductive material such as polysilicon, ion-implanting impurities into the first conductive layer, forming base and collector contact holes in a first resultant structure comprised of the first insulating film and the first conductive layer, to thereby expose a second portion of the base region spaced-apart from the first portion of the base region, and a portion of the collector region, respectively, forming a second conductive layer on a second resultant structure obtained by the preceding steps, the second conductive layer being comprised of a second conductive material such as in-situ doped polysilicon, and, patterning a third resultant structure comprised of the first and second conductive layers in such a manner as to form an emitter comprised of the first conductive material, an emitter contact in contact with the emitter, a base contact in contact with the exposed second portion of the base region, and a collector contact in contact with the exposed portion of the collector region, the emitter, base, and collector contacts being comprised of the second conductive material and being spaced-apart from one another.

BRIEF DESCRIPTION OF THE DRAWINGS

These and various other features and advantages of the present invention will be readily understood with reference to the following detailed description taken in conjunction with the accompanying drawings, wherein like reference numerals designate like structural elements, and, in which.

DETAILED DESCRIPTION OF THE INVENTION

With reference now to FIGS. 9–14, a method for manufacturing a PNP-type BJT having a polysilicon emitter in accordance with a preferred embodiment of the present invention will now be described. More particularly, with particular reference now to FIG. 9, a photoresist layer 104 is deposited on the upper surface of a semiconductor substrate 100 having a collector region 102 formed in a surface region thereof. Subsequently, a hole is formed in the photoresist layer 104 to provide a window for a subsequent ion-implanation step. Specifically, N-type impurities, e.g., phosphorus (P) ions, are ion-implanted into a surface region of the semiconductor substrate 100 through the window formed in the photoresist layer 104, to thereby form a base region 106 in the surface region of the semiconductor substrate 100 in spaced-apart relationship to the collector region 102. In this regard, the patterned photoresist layer 104 serves as an ion-implantation mask. Preferably, the N-type impurites are ion-implanted with an energy of 130–180 KeV and at dose of 3.0 E 13–1.0E 14 ions/cm$^2$.

Figure 1:
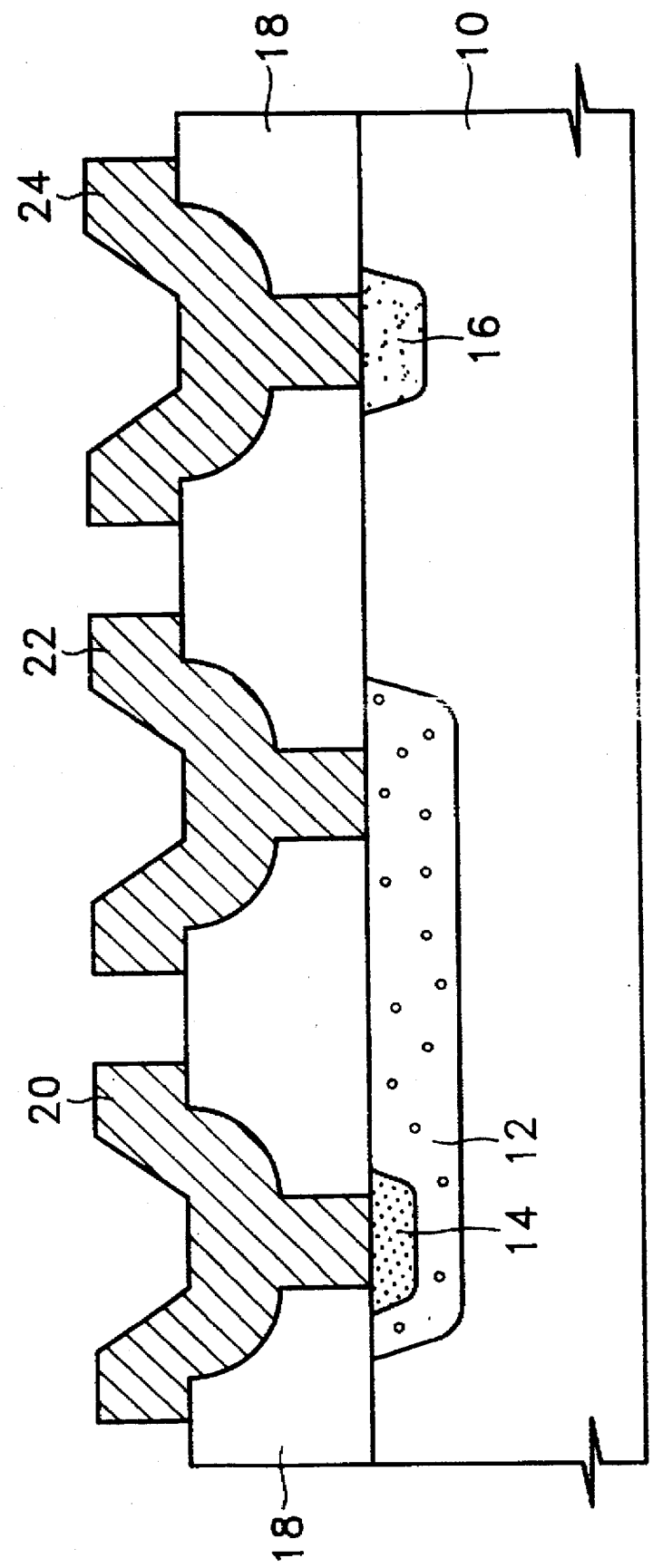
FIG. 1 is a cross-sectional view of a conventional BJT.
Figure 2:
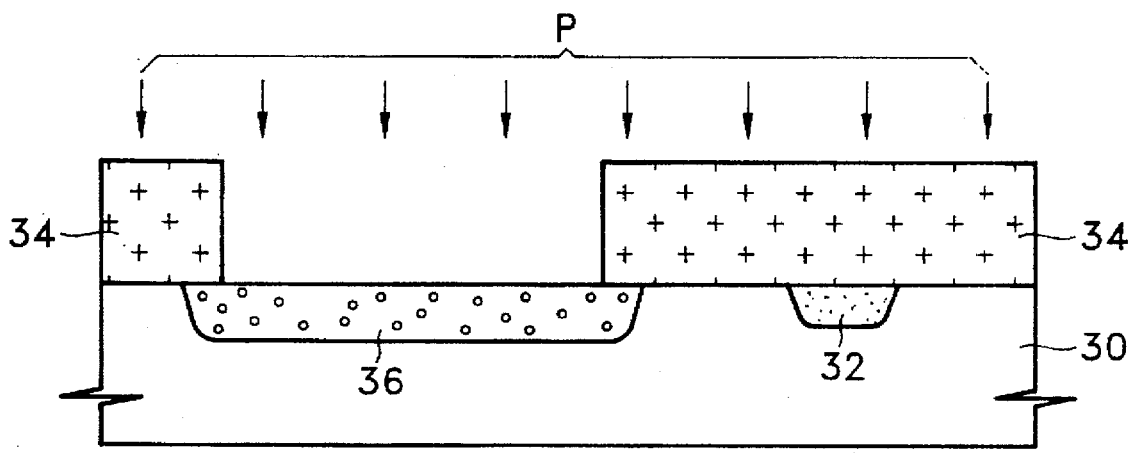
FIGS. 2–8 are cross-sectional views depicting successive steps of a conventional method for manufacturing a PNP-type BJT having a polysilicon emitter; and, FIGS. 9–14 are cross-sectional views depicting successive steps of a method for manufacturing a PNP-type BJT having a polysilicon emitter in accordance with a preferred embodiment of the present invention.
Figure 3:
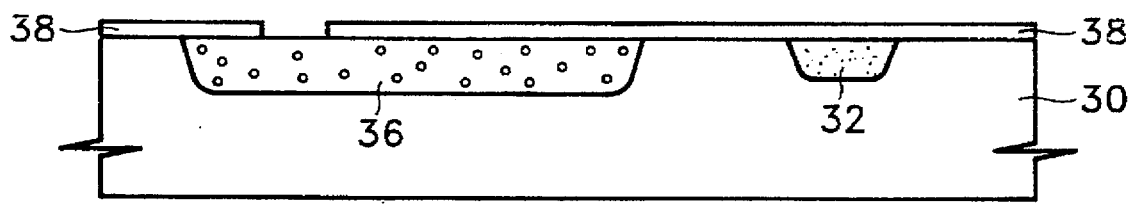
Figure 4:
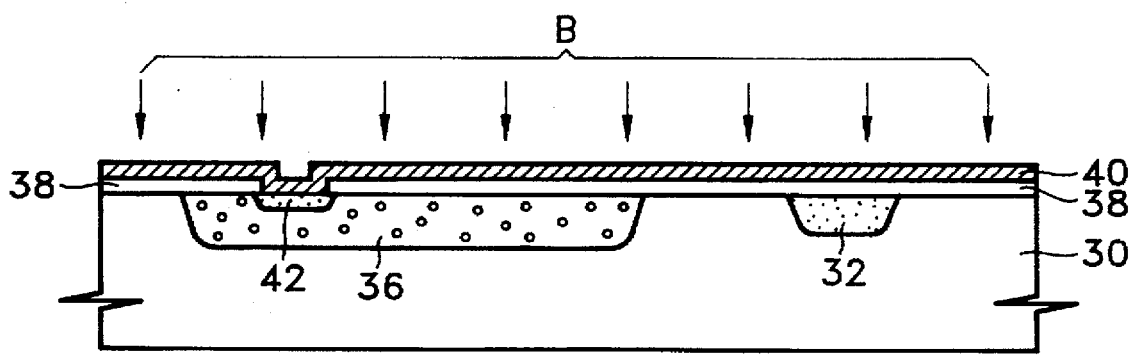
Figure 5:
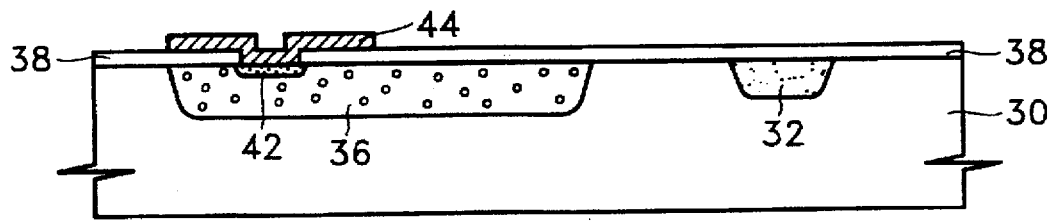
Figure 6:
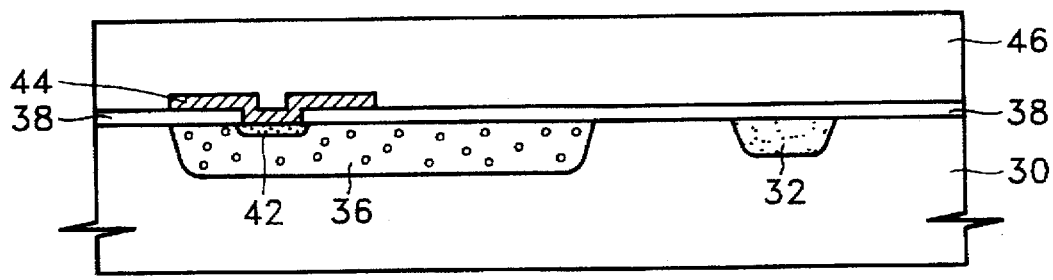
Figure 7:
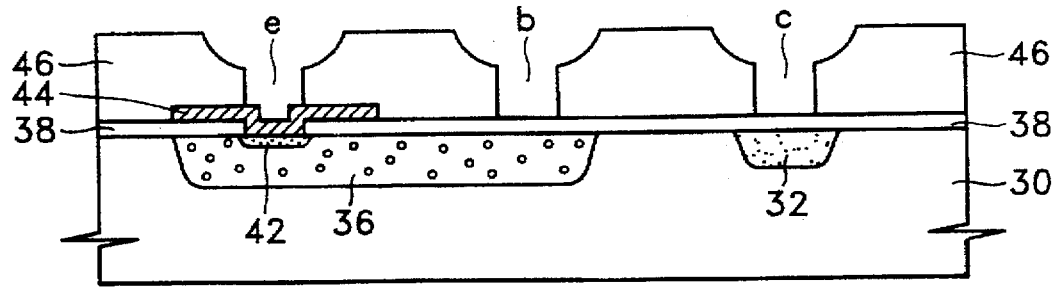
Figure 8:
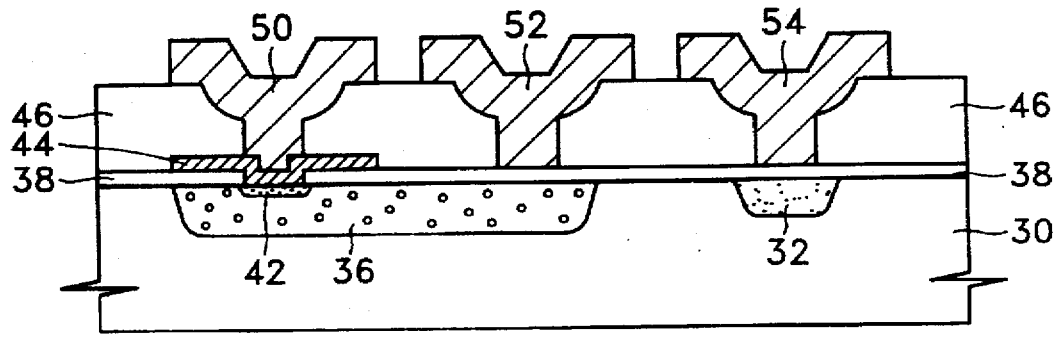
Figure 9:
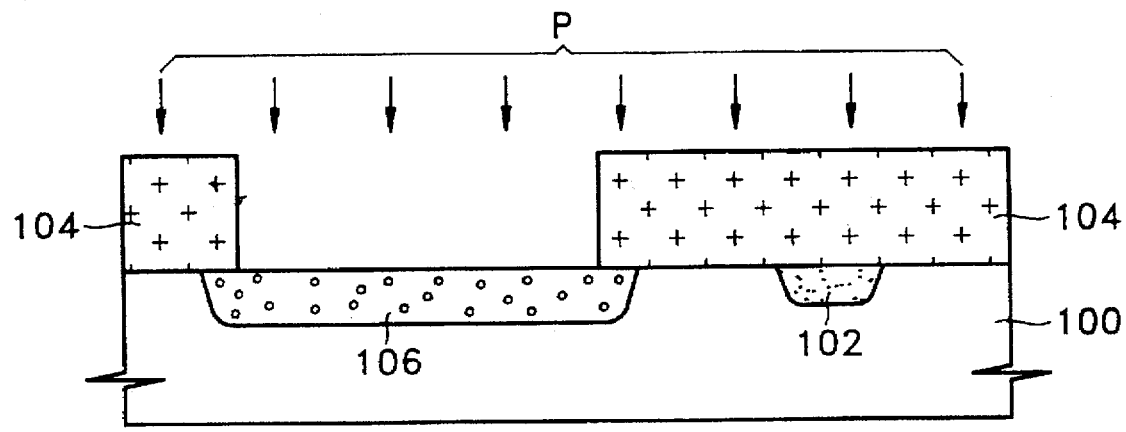
Figure 10:
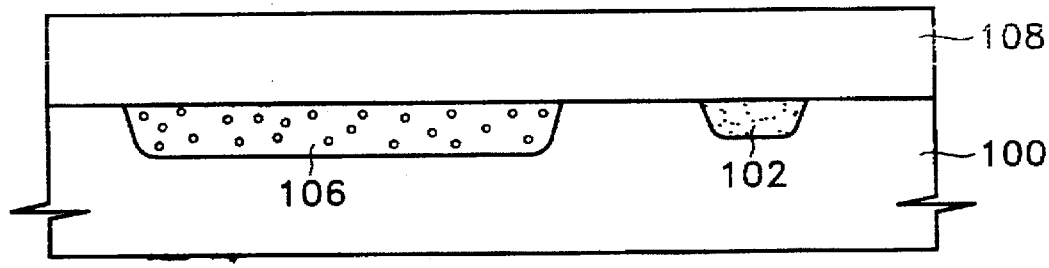

With particular reference now to FIG. 10, the photoresist layer 104 is then removed, and a first insulating film 108, for example a low-temperature oxide (LTO), is formed on the upper surface of the substrate 100, preferably to a thickness of 2,000–6,000 angstroms. Alternatively, the first insulating film 108 can be comprised of a single high-temperature oxide (HTO) layer, or a double layer of LTO-BPSG (borophosposilicate glass) or HTO-BPSG.

Figure 11:
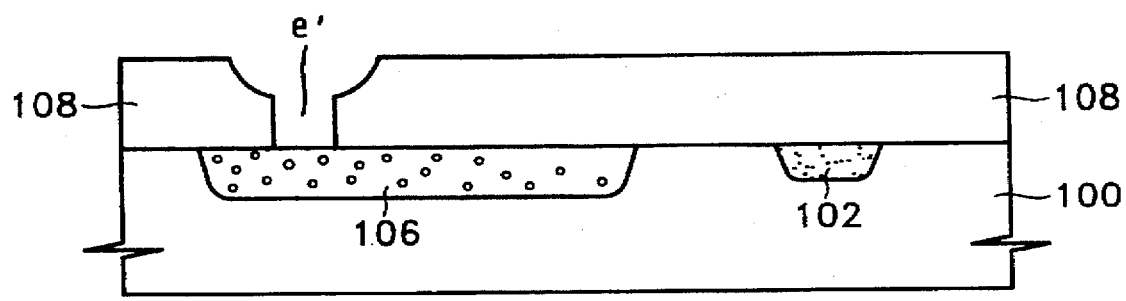

With particular reference now to FIG. 11, an emitter contact hole e' is formed in the first insulating layer 108, to thereby expose a portion of the base region 106. The particular method employed for forming the emitter contact hole e' is not limiting to the present invention. For example, the emitter contact hole e' can be formed by first isotropically etching and then anisotropically etching the first insulating film 108, or, by only anisotropically etching the first insulating film 108.

Figure 12:
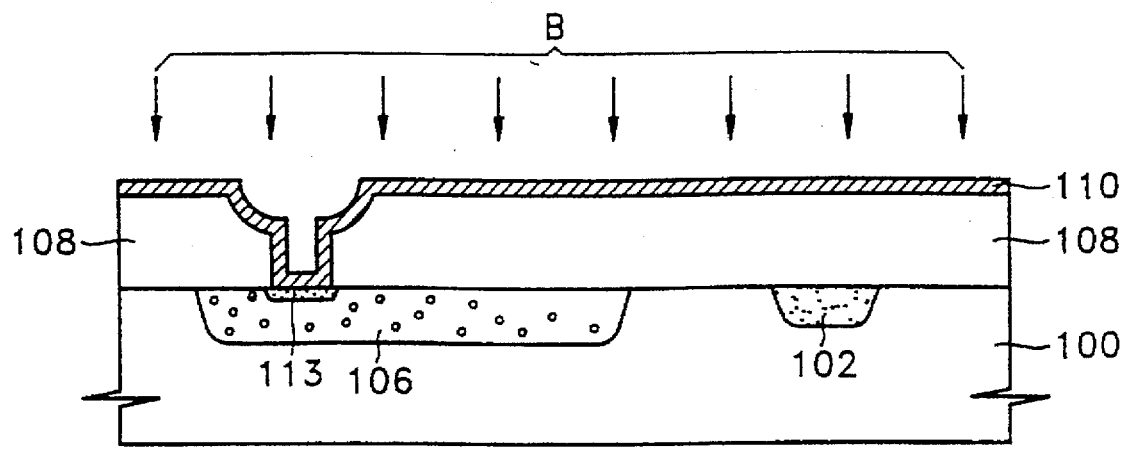

With particular reference now to FIG. 12, a first conductive layer 110 is then deposited on the first insulating layer 108 and the exposed portion of the base region 106, preferably to a thickness of 500–2,000 angstroms. Then, P-type impurities, e.g., boron (B) ions, are ion-implanted into the first conductive layer 110. Next, the resultant structure is annealed, to thereby diffuse the P-type impurities from the first conductive layer 110 into the base region 106, to thereby form an emitter region 113 in the base region 106. Preferably, the P-type impurities are ion-implanted at an energy of 50–100 KeV and at a dose of 2.0 E 15–6.0 E 17 ions/cm$^2$. Although not limiting to the present invention, the annealing step is preferably performed by a rapid thermal annealing (RTA) technique, at a temperature above 600° C., and the first conductive layer is preferably comprised of polysilicon or in-situ polysilicon. Most preferably, the annealing step if performed in a nitrogen atmosphere at a temperature of 800° C.–950° C.

Figure 13:
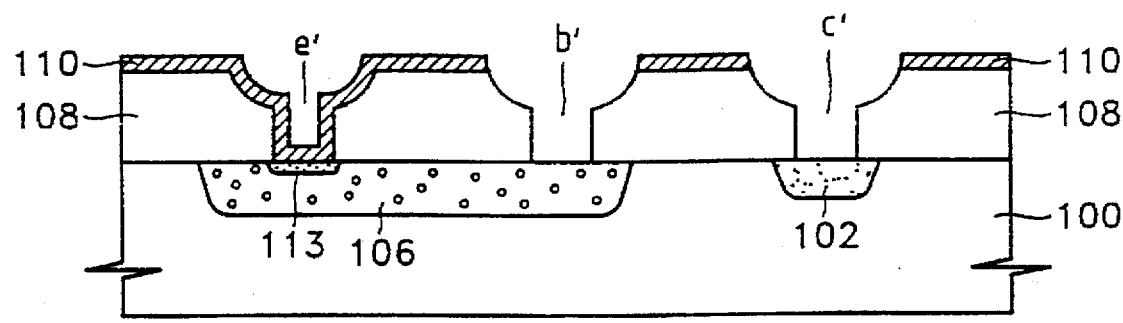

With particular reference now to FIG. 13, a base contact hole b' exposing another portion of the base region 106, and a collector contact hole c' exposing a portion of the collector region 102, are formed in the resultant structure comprised of the first insulating film 108 and the first conductive layer 110. The particular method employed for forming the base and collector contact holes b' and c', respectively, is not limiting to the present invention. For example, the base and collector contact holes b' and c' can be formed by first isotropically etching and then anisotropically etching the resultant structure comprised of the first insulating film 108 and first conductive layer 110, or, by only anisotropically etching the resultant structure.

Figure 14:
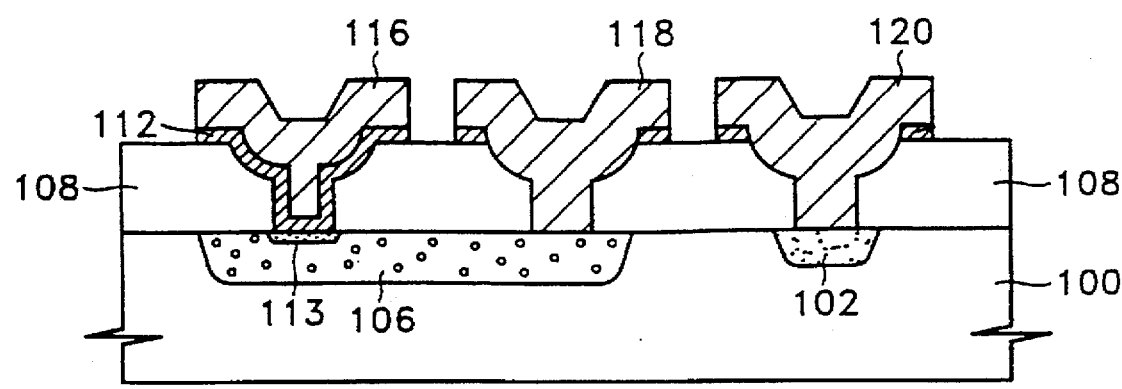

With particular reference now to FIG. 14, a second conductive layer (not shown in its entirety) is then deposited on the resultant structure depicted in FIG. 13, to thereby fill the emitter, base, and collector contact holes e', b', and c' with conductive material. Next, the resultant structure comprised of the second conductive layer and the underlying first conductive layer, is patterned, e.g., by a standard photolithographic etching process, in such a manner as to form a polysilicon emitter 112, an emitter contact 116 in contact with the polysilicon emitter 112, a base contact 118 in contact with the base region 106, and a collector contact 120 in contact with the collector region 102. Although not limiting to the present invention, the second conductive layer is preferably comprised of polysilicon, in-situ doped polysilicon, or a metal silicide.

The above-described method of the present invention results in a BJT having a thin or shallow emitter region 113 which effectively minimizes the base-emitter junction capacitance, without the need for the additional photolithographic steps required by the presently available technology. In this regard, the polysilicon emitter 112 is formed simultaneously with the patterning of the first and second conductive layers, and is self-aligned with the resultant emitter contact 116. Moreover, the necessity of the oxide layer 38 of the conventional method for manufacturing a BJT having a polysilicon emitter depicted in FIGS. 2–8 is eliminated. Accordingly, it can be appreciated that the method for manufacturing a BJT having a polysilicon emitter in accordance with the present invention is less complex and less costly than the conventional method.

Although a preferred embodiment of the present invention has been described in detail hereinabove, it should be clearly understood that many variations and/or modifications of the basic inventive concepts herein taught which may appear to those skilled in the art will still fall within the spirit and scope of the present invention as defined in the appended claims.

What is claimed is:

1. A method for manufacturing a bipolar junction transistor, comprising the steps of:

forming spaced-apart base and collector regions in a surface region of a semiconductor substrate;

forming a first insulating film on said semiconductor substrate;

forming an emitter contact hole in said first insulating film, to thereby expose a first portion of said base region;

forming a first conductive layer on said first insulating film and said exposed first portion of said base region, said first conductive layer being comprised of a first conductive material;

ion-implanting impurities into said first conductive layer;

forming base and collector contact holes in a first resultant structure by sequentially etching said first conductive layer and said first insulating film in a continuous etching process to thereby expose a second portion of said base region spaced-apart from said first portion of said base region, and a portion of said collector region, respectively;

forming a second conductive layer on a second resultant structure obtained by the preceding steps, said second conductive layer being comprised of a second conductive material; and patterning a third resultant structure comprised of said first and second conductive layers in such a manner as to form an emitter comprised of said first conductive material, an emitter contact in contact with said emitter, a base contact in contact with said exposed second portion of said base region, and a collector contact in contact with said exposed portion of said collector region, said emitter, base and collector contacts being comprised of said second conductive material and being spaced-apart from one another.

2. The method as set forth in claim 1, wherein said first insulating film is comprised of an insulating material selected from the group consisting of LTO, HTO, LTO-BPSG, and HTO-BPSG.

3. The method as set forth in claim 1, wherein said first conductive material is selected from the group consisting of polysilicon and in-situ doped polysilicon.

4. The method as set forth in claim 3, wherein said second conductive material is selected from the group consisting of polysilicon, in-situ doped polysilicon, and metal silicide.

5. The method as set forth in claim 4, wherein:

said first conductive material is selected from the group consisting of polysilicon and in-situ doped polysilicon; and, said second conductive material is selected from the group consisting of polysilicon, in-situ doped polysilicon, and metal silicide.

6. The method as set forth in claim 5, wherein said first insulating film is comprised of an insulating material selected from the group consisting of LTO, HTO, LTO-BPSG, and HTO-BPSG.

7. The method as set forth in claim 1, further comprising the step of annealing said first resultant structure after the ion-implanting step and prior to the step of forming base and collector contact holes, in such a manner as to diffuse said ion-implanted impurities into said base region, to thereby form an emitter region in said base region, wherein said emitter is in contact with said emitter region.

8. The method as set forth in claim 7, wherein the annealing step is performed in a nitrogen atmosphere at a temperature of 800°–950° C.

9. The method as set forth in claim 7, wherein the annealing step is performed by a rapid thermal annealing process carried out at a temperature above 600° C.

10. The method as set forth in claim 9, wherein the annealing step is performed in a nitrogen atmosphere.

11. The method as set forth in claim 1, wherein said second conductive material is selected from the group consisting of polysilicon, in-situ doped polysilicon, and metal silicide.

12. The method as set forth in claim 1, wherein said impurities are ion-implanted in the ion-implanting step at an energy of 50–100 KeV and at a dose of $2.0 \text{ E } 15$–$6.0 \text{ E } 17$ ions/cm$^2$.

13. The method as set forth in claim 1, wherein said base region is formed by ion-implanting impurities of a first conductivity type into said surface region of said semiconductor substrate.

14. The method as set forth in claim 3, wherein said impurities ion-implanted into said first conductive layer are of a second conductivity type opposite from said first conductivity type.

15. The method as set forth in claim 4, wherein said impurities of said first conductivity type are ion-implanted into said surface region of said substrate at an energy of 130–180 KeV and at a dose of $3.0 \text{ E } 13$–$1.0 \text{ E } 14$ ions/cm$^2$.

16. The method as set forth in claim 15, wherein said impurities of said second conductivity type are ion-implanted into said first conductive layer at an energy of 50–100 KeV and at a dose of $2.0 \text{ E } 15$–$6.0 \text{ E } 17$ ions/cm$^2$.

17. The method as set forth in claim 16, wherein said first conductivity type is N, and said second conductivity type is P.

* * * * *